US008427791B2

(12) United States Patent
Gao et al.

(10) Patent No.: US 8,427,791 B2
(45) Date of Patent: Apr. 23, 2013

(54) MAGNETIC TUNNEL JUNCTION HAVING A MAGNETIC INSERTION LAYER AND METHODS OF PRODUCING THE SAME

(75) Inventors: Zheng Gao, San Jose, CA (US); Liubo Hong, San Jose, CA (US); Richard Hsiao, San Jose, CA (US); Sangmun Oh, San Jose, CA (US); Chando Park, Palo Alto, CA (US); Chang-Man Park, Mountain View, CA (US)

(73) Assignee: HGST Netherlands B.V., Amsterdam (NL)

( * ) Notice: Subject to any disclaimer, the term of this patent is extended or adjusted under 35 U.S.C. 154(b) by 144 days.

(21) Appl. No.: 12/953,233

(22) Filed: Nov. 23, 2010

(65) Prior Publication Data
US 2012/0127603 A1 May 24, 2012

(51) Int. Cl.
*G11B 5/39* (2006.01)
(52) U.S. Cl.
USPC .................................. 360/324.12; 360/324.2
(58) Field of Classification Search ............... 360/324.1, 360/324.11, 324.12, 324.2
See application file for complete search history.

(56) References Cited

U.S. PATENT DOCUMENTS

| 7,241,631 | B2* | 7/2007 | Huai et al. ........................ 438/3 |
|---|---|---|---|
| 7,480,173 | B2 | 1/2009 | Guo et al. |
| 7,489,541 | B2* | 2/2009 | Pakala et al. ................... 365/158 |
| 7,505,235 | B2 | 3/2009 | Freitag et al. |
| 7,595,520 | B2 | 9/2009 | Horng et al. |
| 7,663,848 | B1 | 2/2010 | Huai et al. |
| 7,672,088 | B2* | 3/2010 | Zhang et al. ............. 360/324.11 |
| 7,808,747 | B2* | 10/2010 | Fuji et al. ................... 360/324.1 |
| 7,843,669 | B2* | 11/2010 | Fukuzawa et al. ......... 360/324.1 |
| 7,924,607 | B2* | 4/2011 | Yoshikawa et al. ........... 365/158 |
| 7,978,439 | B2* | 7/2011 | Zhang et al. ............. 360/324.11 |
| 8,059,374 | B2* | 11/2011 | Zhao et al. .................. 360/324.2 |
| 8,139,405 | B2* | 3/2012 | Yoshikawa et al. ........... 365/173 |
| 8,194,365 | B1* | 6/2012 | Leng et al. ............... 360/324.12 |
| 8,202,572 | B2* | 6/2012 | Zhao et al. .................... 427/130 |
| 2008/0080101 | A1 | 4/2008 | Mauri et al. |
| 2008/0164548 | A1 | 7/2008 | Ranjan et al. |
| 2008/0191251 | A1 | 8/2008 | Ranjan et al. |
| 2008/0239589 | A1 | 10/2008 | Guo et al. |
| 2008/0316657 | A1 | 12/2008 | Zhang et al. |

(Continued)

OTHER PUBLICATIONS

Yu et al., "Inter-diffusion study in MgO tunneling magneto-resistive (TMR) system by XPS," Applied Surface Science 256, 2010, p. 6592-6595.

(Continued)

*Primary Examiner* — Angel A. Castro
(74) *Attorney, Agent, or Firm* — Zilka-Kotab, PC

(57) ABSTRACT

According to one embodiment, a magnetic head includes a barrier layer having a crystalline structure, a first magnetic layer above the barrier layer, a magnetic insertion layer above the first magnetic layer, and a second magnetic layer above the magnetic insertion layer, the second magnetic layer having a textured face-centered cubic (fcc) structure. The first magnetic layer comprises a high spin polarization magnetic material having a crystalline structure and a characteristic of crystallization being more similar to the crystalline structure of the barrier layer than a crystalline structure of the second magnetic layer and the magnetic insertion layer comprises a magnetic material having a crystalline structure and a characteristic of crystallization being more similar to the crystalline structure of the second magnetic layer than the crystalline structure of the barrier layer. Additional magnetic head structures and methods of producing magnetic heads are described according to more embodiments.

21 Claims, 9 Drawing Sheets

U.S. PATENT DOCUMENTS

| | | |
|---|---|---|
| 2009/0121710 A1 | 5/2009 | Wang et al. |
| 2009/0155629 A1 | 6/2009 | Gill |
| 2009/0168270 A1* | 7/2009 | Takahashi et al. ....... 360/324.11 |
| 2009/0213503 A1 | 8/2009 | Sun et al. |
| 2009/0244791 A1 | 10/2009 | Lin |
| 2010/0073827 A1 | 3/2010 | Zhao et al. |
| 2010/0073828 A1 | 3/2010 | Wang et al. |
| 2010/0078310 A1 | 4/2010 | Tsunekawa et al. |
| 2010/0123208 A1 | 5/2010 | Zhao et al. |

OTHER PUBLICATIONS

Tsunekawa et al., "Effect of Capping Layer Material On Tunnel Magnetoresistance in CoFeB/MgO/CoFeB Magnetic Tunnel Junctions," Digest of the IEEE International Magnetics Conference, 2005, INTERMAG Asia 2005, Apr. 4-8, 2005, p. 1983-1984.

Lee et al., "Effect of Interlayer coupling in CoFeB/Ta/NiFe free layers on the critical switching current of Mg0-based magnetic tunnel junctions," Journal of Aplied Physics 106, 2009, p. 1-4.

* cited by examiner

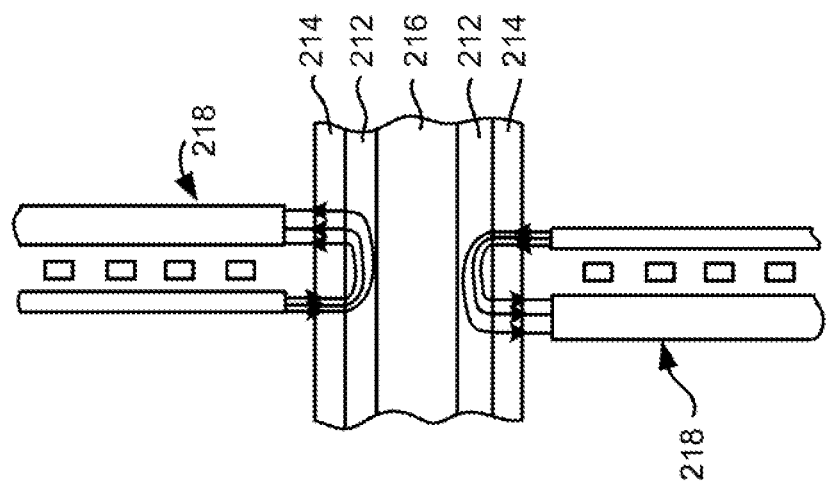
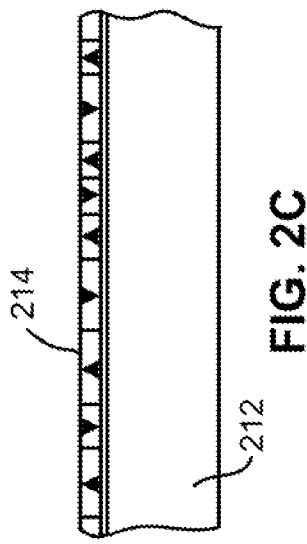
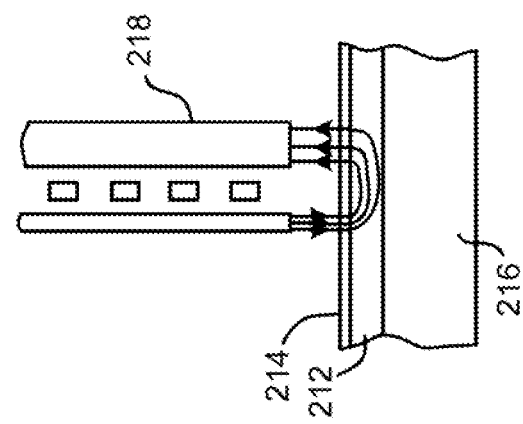
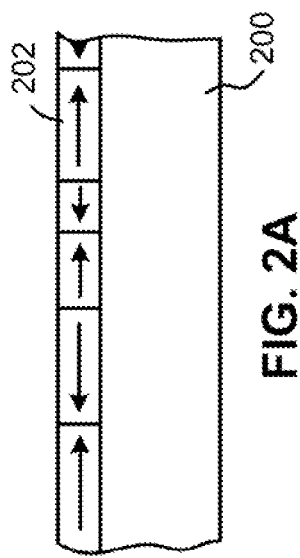
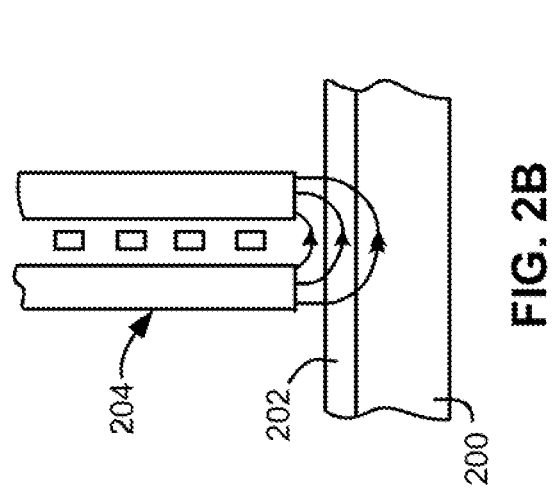

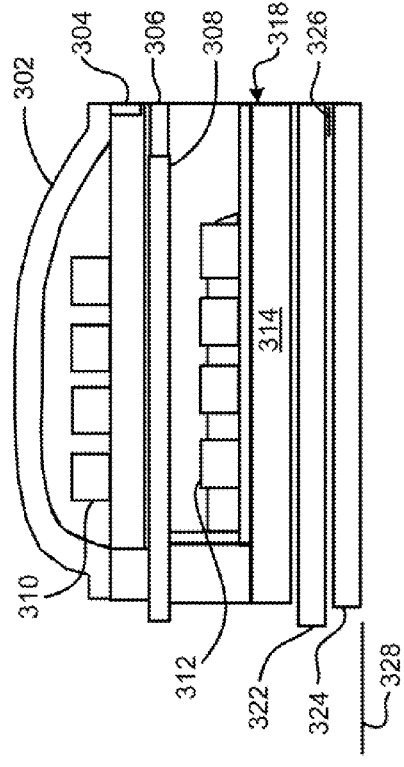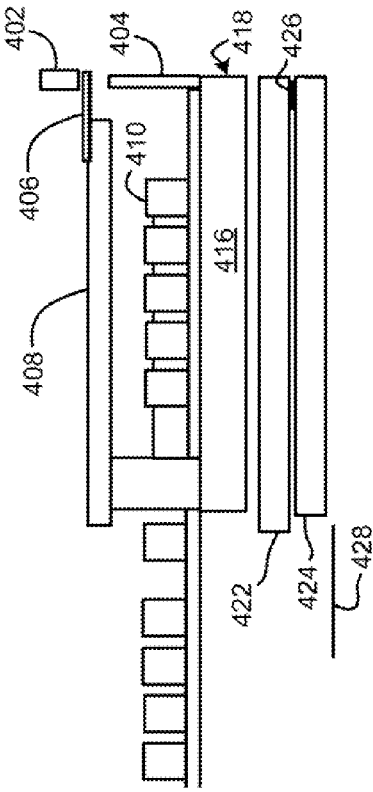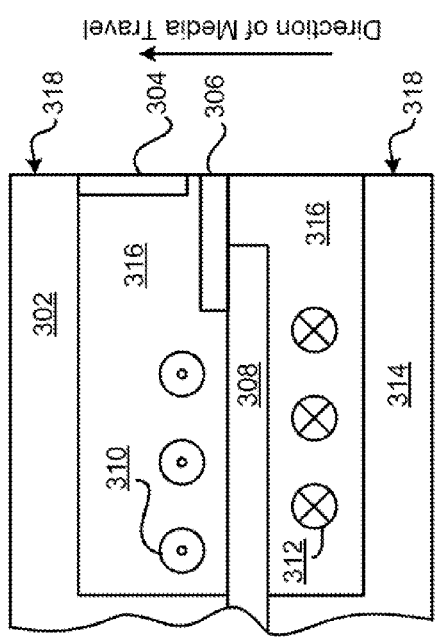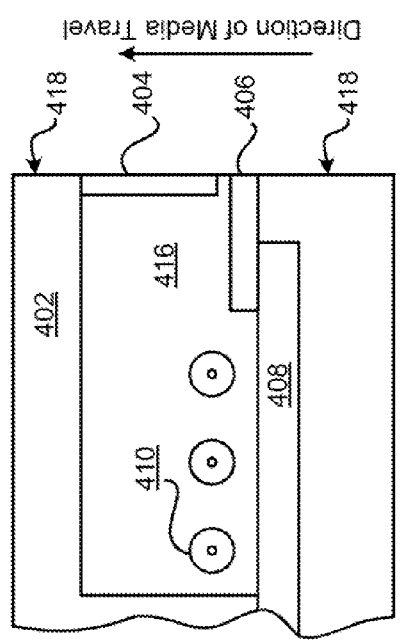

MAGNETIC TUNNEL JUNCTION HAVING A MAGNETIC INSERTION LAYER AND METHODS OF PRODUCING THE SAME

FIELD OF THE INVENTION

The present invention relates to magnetic recording devices, and more particularly, this invention relates to a magnetic recording head having a tunnel junction with a magnetic insertion layer.

BACKGROUND OF THE INVENTION

The heart of a computer is a magnetic disk drive which typically includes a rotating magnetic disk, a slider that has read and write heads, a suspension arm above the rotating disk and an actuator arm that swings the suspension arm to place the read and/or write heads over selected circular tracks on the rotating disk. The suspension arm biases the slider into contact with the surface of the disk when the disk is not rotating but, when the disk rotates, air is swirled by the rotating disk adjacent an air bearing surface (ABS) of the slider causing the slider to ride on an air bearing a slight distance from the surface of the rotating disk. When the slider rides on the air bearing, the write and read heads are employed for writing magnetic impressions to and reading magnetic signal fields from the rotating disk. The read and write heads are connected to processing circuitry that operates according to a computer program to implement the writing and reading functions.

As the area storage density in hard disk drives (HDDs) increases, the demand for a larger magnetoresistive effect has led to extensive research efforts worldwide. Particularly, a MgO barrier-based magnetic tunnel junction (MTJ) is currently being used in HDDs. In typical MgO-MTJs, band matching between a MgO barrier and adjacent magnetic layers is a requirement to obtain a high magnetoresistance (MR), which is closely related to the epitaxial relationship between the MgO barrier and adjacent layers. Generally, these adjacent layers are amorphous magnetic layers, such as CoFeB and the like. In order to obtain a high MR ratio in amorphous CoFeB/crystalline MgO/amorphous CoFeB MTJs, an annealing step is necessary in order to produce crystallized bcc CoFeB (100)/MgO(100)/crystallized bcc CoFeB (100). In a magnetic head, a free layer should produce a high MR and lower magnetostriction; especially in MgO-MTJ heads, the free layer includes the first magnetic layer with high spin polarization, which typically shows highly positive magnetostriction A common approach is to make a multilayer free layer with a thin, high-spin polarization layer next to the barrier layer and a relatively thick layer of NiFe alloy, which has negative magnetostriction. NiFe which has a Fe content of less than 10% is used as a negative magnetostriction free layer for some MgO-MTJ sensors. When the sputtered NiFe film is used as second free layer, it destroys the epitaxial relationship between the MgO barrier and the first free layer due to the highly textured fcc NiFe films which cause the crystallization to occur from the NiFe/first magnetic layer (generally a CoFeB layer) interface. This leads to a low MR. Currently, in order to solve this problem, pure Ta can be inserted between NiFe and the first magnetic layer to prevent the crystallization from occurring in the NiFe/first magnetic layer. However, a pure Ta layer reduces the magnetic coupling strength between NiFe and the first magnetic layer, and acts as an interface (impurity) which is believed to be a noise source.

Therefore, there is a need in the art for a MgO-MTJ that has sufficient band matching between the MgO barrier and adjacent magnetic layers, has a high MR, and does not succumb to the issues associated with conventional MgO-MTJ head designs.

SUMMARY OF THE INVENTION

In one embodiment, a magnetic head includes a barrier layer, a first magnetic layer above the barrier layer, a magnetic insertion layer above the first magnetic layer, and a second magnetic layer above the magnetic insertion layer.

In another embodiment, a magnetic head includes a barrier layer having a crystalline structure, a first magnetic layer above the barrier layer, a magnetic insertion layer above the first magnetic layer, and a second magnetic layer above the magnetic insertion layer, the second magnetic layer having a textured face-centered cubic (fcc) structure. The first magnetic layer comprises a high spin polarization magnetic material having a crystalline structure and a characteristic of crystallization being more similar to the crystalline structure of the barrier layer than a crystalline structure of the second magnetic layer and the magnetic insertion layer comprises a magnetic material having a crystalline structure and a characteristic of crystallization being more similar to the crystalline structure of the second magnetic layer than the crystalline structure of the barrier layer.

In yet another embodiment, a method for forming a magnetic head includes forming a barrier layer, forming a first magnetic layer above the barrier layer, forming an insertion layer above the first magnetic layer, the insertion layer being comprised of a magnetic material, and forming a second magnetic layer above the insertion layer.

Any of these embodiments may be implemented in the production of a magnetic data storage system such as a disk drive system, which may include a magnetic head, a drive mechanism for passing a magnetic medium (e.g., hard disk) over the magnetic head, and a controller electrically coupled to the magnetic head.

Other aspects and advantages of the present invention will become apparent from the following detailed description, which, when taken in conjunction with the drawings, illustrate by way of example the principles of the invention.

BRIEF DESCRIPTION OF THE DRAWINGS

For a fuller understanding of the nature and advantages of the present invention, as well as the preferred mode of use, reference should be made to the following detailed description read in conjunction with the accompanying drawings.

FIG. 2A is a schematic representation in section of a recording medium utilizing a longitudinal recording format.

FIG. 2B is a schematic representation of a conventional magnetic recording head and recording medium combination for longitudinal recording as in FIG. 2A.

FIG. 2C is a magnetic recording medium utilizing a perpendicular recording format.

FIG. 2D is a schematic representation of a recording head and recording medium combination for perpendicular recording on one side.

FIG. 2E is a schematic representation of a recording apparatus adapted for recording separately on both sides of the medium.

FIG. 3A is a cross-sectional view of one particular embodiment of a perpendicular magnetic head with helical coils.

FIG. 3B is a cross-sectional view of one particular embodiment of a piggyback magnetic head with helical coils.

FIG. 4A is a cross-sectional view of one particular embodiment of a perpendicular magnetic head with looped coils.

FIG. 4B is a cross-sectional view of one particular embodiment of a piggyback magnetic head with looped coils.

DETAILED DESCRIPTION

The following description is made for the purpose of illustrating the general principles of the present invention and is not meant to limit the inventive concepts claimed herein. Further, particular features described herein can be used in combination with other described features in each of the various possible combinations and permutations.

Unless otherwise specifically defined herein, all terms are to be given their broadest possible interpretation including meanings implied from the specification as well as meanings understood by those skilled in the art and/or as defined in dictionaries, treatises, etc.

It must also be noted that, as used in the specification and the appended claims, the singular forms "a," "an" and "the" include plural referents unless otherwise specified.

The following description discloses several preferred embodiments of disk-based storage systems and/or related systems and methods, as well as operation and/or component parts thereof.

In one general embodiment, a magnetic head includes a barrier layer, a first magnetic layer above the barrier layer, a magnetic insertion layer above the first magnetic layer, and a second magnetic layer above the magnetic insertion layer.

In another general embodiment, a magnetic head includes a barrier layer having a crystalline structure, a first magnetic layer above the barrier layer, a magnetic insertion layer above the first magnetic layer, and a second magnetic layer above the magnetic insertion layer, the second magnetic layer having a textured face-centered cubic (fcc) structure. The first magnetic layer comprises a high spin polarization magnetic material having a crystalline structure and a characteristic of crystallization being more similar to the crystalline structure of the barrier layer than a crystalline structure of the second magnetic layer and the magnetic insertion layer comprises a magnetic material having a crystalline structure and a characteristic of crystallization being more similar to the crystalline structure of the second magnetic layer than the crystalline structure of the barrier layer.

In yet another general embodiment, a method for forming a magnetic head includes forming a barrier layer, forming a first magnetic layer above the barrier layer, forming an insertion layer above the first magnetic layer, the insertion layer being comprised of a magnetic material, and forming a second magnetic layer above the insertion layer.

Figure 1:
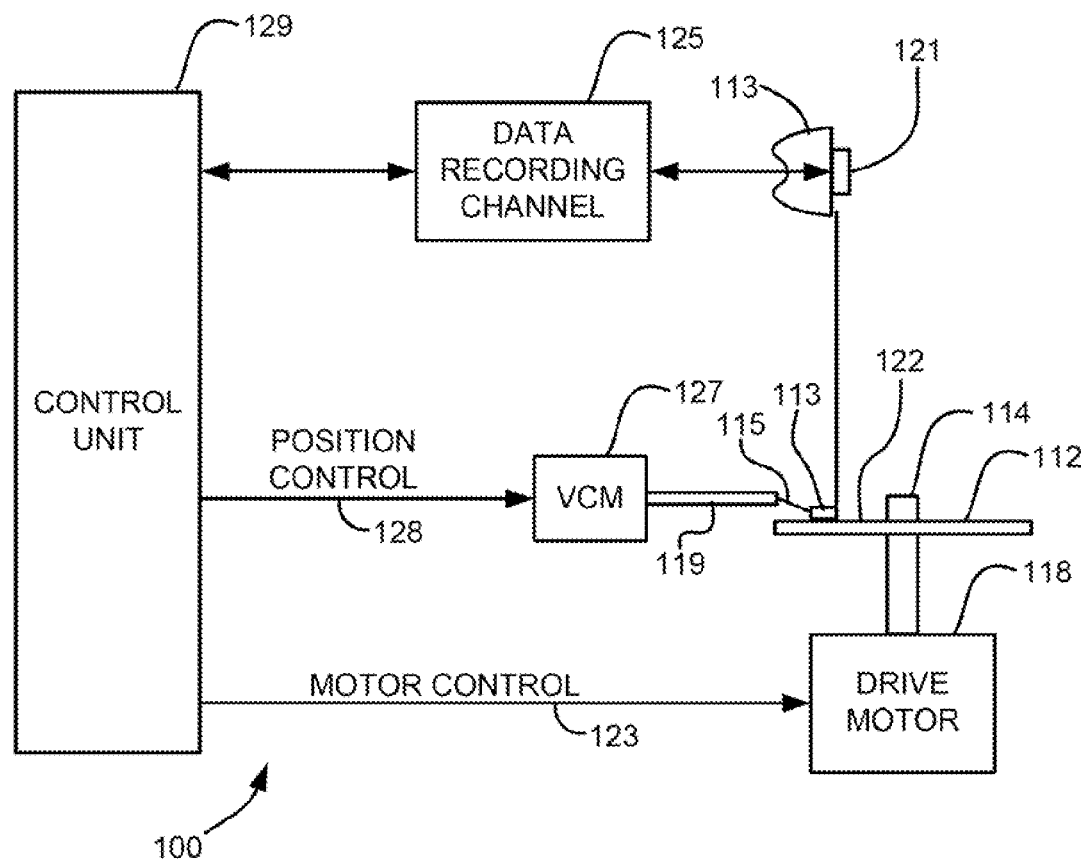
FIG. 1 is a simplified drawing of a magnetic recording disk drive system.

Referring now to FIG. 1, there is shown a disk drive 100 in accordance with one embodiment of the present invention. As shown in FIG. 1, at least one rotatable magnetic disk 112 is supported on a spindle 114 and rotated by a disk drive motor 118. The magnetic recording on each disk is typically in the form of an annular pattern of concentric data tracks (not shown) on the disk 112.

At least one slider 113 is positioned near the disk 112, each slider 113 supporting one or more magnetic read/write heads 121. As the disk rotates, slider 113 is moved radially in and out over disk surface 122 so that heads 121 may access different tracks of the disk where desired data are recorded and/or to be written. Each slider 113 is attached to an actuator arm 119 by means of a suspension 115. The suspension 115 provides a slight spring force which biases slider 113 against the disk surface 122. Each actuator arm 119 is attached to an actuator 127. The actuator 127 as shown in FIG. 1 may be a voice coil motor (VCM). The VCM comprises a coil movable within a fixed magnetic field, the direction and speed of the coil movements being controlled by the motor current signals supplied by controller 129.

During operation of the disk storage system, the rotation of disk 112 generates an air bearing between slider 113 and disk surface 122 which exerts an upward force or lift on the slider. The air bearing thus counter-balances the slight spring force of suspension 115 and supports slider 113 off and slightly above the disk surface by a small, substantially constant spacing during normal operation. Note that in some embodiments, the slider 113 may slide along the disk surface 122.

The various components of the disk storage system are controlled in operation by control signals generated by control unit 129, such as access control signals and internal clock signals. Typically, control unit 129 comprises logic control circuits, storage (e.g., memory), and a microprocessor. The control unit 129 generates control signals to control various system operations such as drive motor control signals on line 123 and head position and seek control signals on line 128. The control signals on line 128 provide the desired current profiles to optimally move and position slider 113 to the desired data track on disk 112. Read and write signals are communicated to and from read/write heads 121 by way of recording channel 125.

The above description of a typical magnetic disk storage system, and the accompanying illustration of FIG. 1 is for representation purposes only. It should be apparent that disk storage systems may contain a large number of disks and actuators, and each actuator may support a number of sliders.

An interface may also be provided for communication between the disk drive and a host (integral or external) to send and receive the data and for controlling the operation of the disk drive and communicating the status of the disk drive to the host, all as will be understood by those of skill in the art.

In a typical head, an inductive write head includes a coil layer embedded in one or more insulation layers (insulation stack), the insulation stack being located between first and second pole piece layers. A gap is formed between the first and second pole piece layers by a gap layer at an air bearing surface (ABS) of the write head. The pole piece layers may be connected at a back gap. Currents are conducted through the coil layer, which produce magnetic fields in the pole pieces. The magnetic fields fringe across the gap at the ABS for the purpose of writing bits of magnetic field information in tracks on moving media, such as in circular tracks on a rotating magnetic disk.

The second pole piece layer has a pole tip portion which extends from the ABS to a flare point and a yoke portion which extends from the flare point to the back gap. The flare point is where the second pole piece begins to widen (flare) to form the yoke. The placement of the flare point directly affects the magnitude of the magnetic field produced to write information on the recording medium.

FIG. 2A illustrates, schematically, a conventional recording medium such as used with magnetic disc recording systems, such as that shown in FIG. 1. This medium is utilized for recording magnetic impulses in or parallel to the plane of the medium itself. The recording medium, a recording disc in this instance, comprises basically a supporting substrate 200 of a suitable non-magnetic material such as glass, with an overlying coating 202 of a suitable and conventional magnetic layer.

FIG. 2B shows the operative relationship between a conventional recording/playback head 204, which may preferably be a thin film head, and a conventional recording medium, such as that of FIG. 2A.

FIG. 2C illustrates, schematically, the orientation of magnetic impulses substantially perpendicular to the surface of a recording medium as used with magnetic disc recording systems, such as that shown in FIG. 1. For such perpendicular recording the medium typically includes an under layer 212 of a material having a high magnetic permeability. This under layer 212 is then provided with an overlying coating 214 of magnetic material preferably having a high coercivity relative to the under layer 212.

FIG. 2D illustrates the operative relationship between a perpendicular head 218 and a recording medium. The recording medium illustrated in FIG. 2D includes both the high permeability under layer 212 and the overlying coating 214 of magnetic material described with respect to FIG. 2C above. However, both of these layers 212 and 214 are shown applied to a suitable substrate 216. Typically there is also an additional layer (not shown) called an "exchange-break" layer or "interlayer" between layers 212 and 214.

In this structure, the magnetic lines of flux extending between the poles of the perpendicular head 218 loop into and out of the overlying coating 214 of the recording medium with the high permeability under layer 212 of the recording medium causing the lines of flux to pass through the overlying coating 214 in a direction generally perpendicular to the surface of the medium to record information in the overlying coating 214 of magnetic material preferably having a high coercivity relative to the under layer 212 in the form of magnetic impulses having their axes of magnetization substantially perpendicular to the surface of the medium. The flux is channeled by the soft underlying coating 212 back to the return layer (P1) of the head 218.

FIG. 2E illustrates a similar structure in which the substrate 216 carries the layers 212 and 214 on each of its two opposed sides, with suitable recording heads 218 positioned adjacent the outer surface of the magnetic coating 214 on each side of the medium, allowing for recording on each side of the medium.

FIG. 3A is a cross-sectional view of a perpendicular magnetic head. In FIG. 3A, helical coils 310 and 312 are used to create magnetic flux in the stitch pole 308, which then delivers that flux to the main pole 306. Coils 310 indicate coils extending out from the page, while coils 312 indicate coils extending into the page. Stitch pole 308 may be recessed from the ABS 318. Insulation 316 surrounds the coils and may provide support for some of the elements. The direction of the media travel, as indicated by the arrow to the right of the structure, moves the media past the lower return pole 314 first, then past the stitch pole 308, main pole 306, trailing shield 304 which may be connected to the wrap around shield (not shown), and finally past the upper return pole 302. Each of these components may have a portion in contact with the ABS 318. The ABS 318 is indicated across the right side of the structure.

Perpendicular writing is achieved by forcing flux through the stitch pole 308 into the main pole 306 and then to the surface of the disk positioned towards the ABS 318.

FIG. 3B illustrates a piggyback magnetic head having similar features to the head of FIG. 3A. Two shields 304, 314 flank the stitch pole 308 and main pole 306. Also sensor shields 322, 324 are shown. The sensor 326 is typically positioned between the sensor shields 322, 324.

FIG. 4A is a schematic diagram of one embodiment which uses looped coils 410, sometimes referred to as a pancake configuration, to provide flux to the stitch pole 408. The stitch pole then provides this flux to the main pole 406. In this orientation, the lower return pole is optional. Insulation 416 surrounds the coils 410, and may provide support for the stitch pole 408 and main pole 406. The stitch pole may be recessed from the ABS 418. The direction of the media travel, as indicated by the arrow to the right of the structure, moves the media past the stitch pole 408, main pole 406, trailing shield 404 which may be connected to the wrap around shield (not shown), and finally past the upper return pole 402 (all of which may or may not have a portion in contact with the ABS 418). The ABS 418 is indicated across the right side of the structure. The trailing shield 404 may be in contact with the main pole 406 in some embodiments.

FIG. 4B illustrates another type of piggyback magnetic head having similar features to the head of FIG. 4A including a looped coil 410, which wraps around to form a pancake coil. Also, sensor shields 422, 424 are shown. The sensor 426 is typically positioned between the sensor shields 422, 424.

In FIGS. 3B and 4B, an optional heater 328, 428 is shown near the non-ABS side of the magnetic head. A heater 328, 428 may also be included in the magnetic heads shown in FIGS. 3A and 4A. The position of this heater 328, 428 may vary based on design parameters such as where the protrusion is desired, coefficients of thermal expansion of the surrounding layers, etc.

Figure 5A:
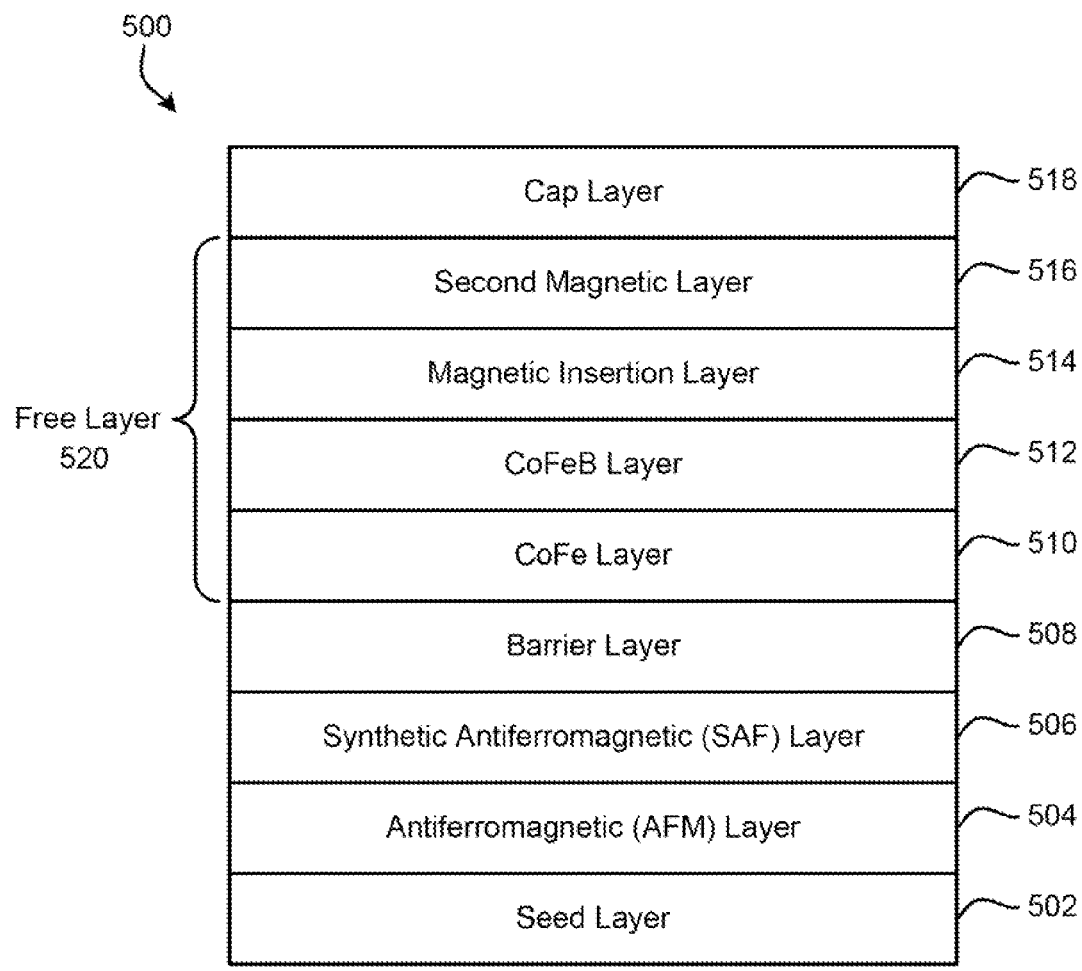
FIG. 5A is a cross-sectional view of a portion of a magnetic head, according to one embodiment.
Figure 5B:
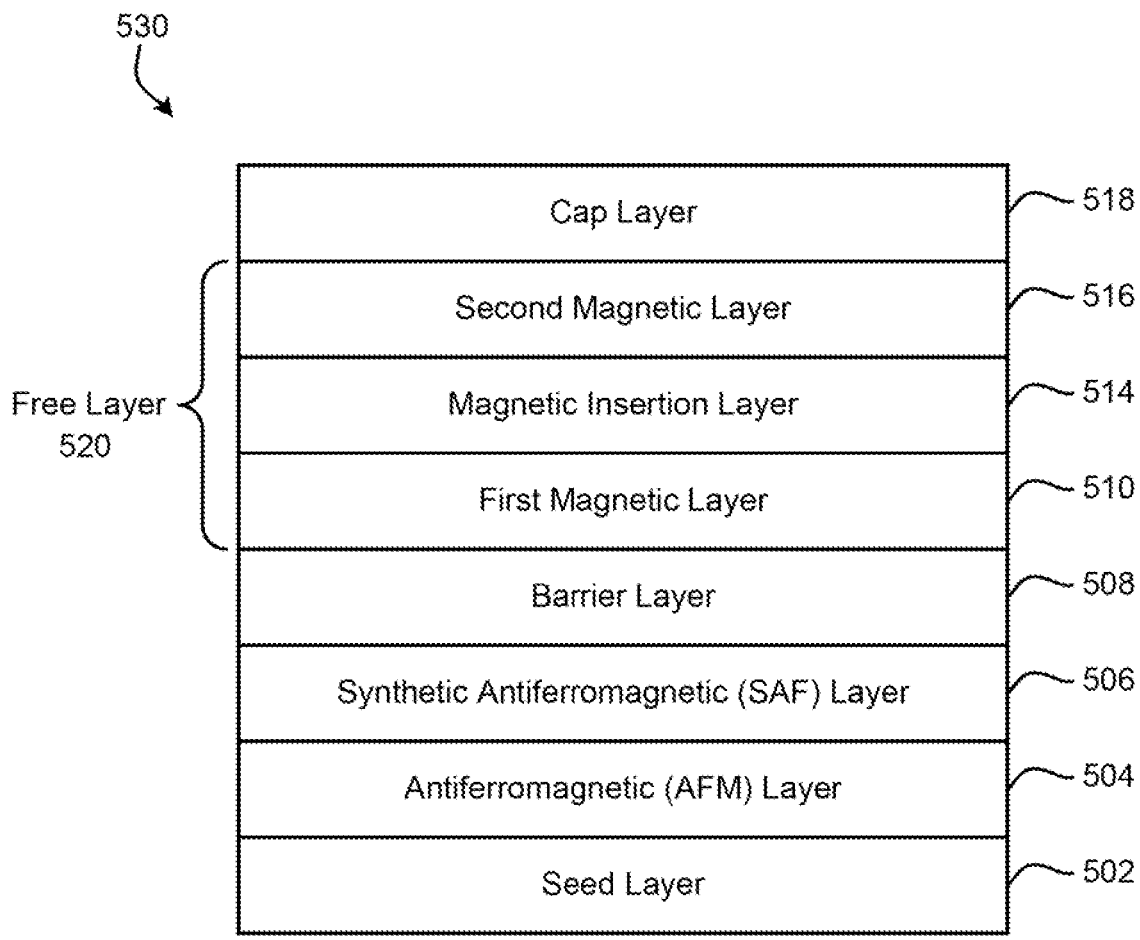
FIG. 5B is a cross-sectional view of a portion of a magnetic head, according to one embodiment.
Figure 5C:
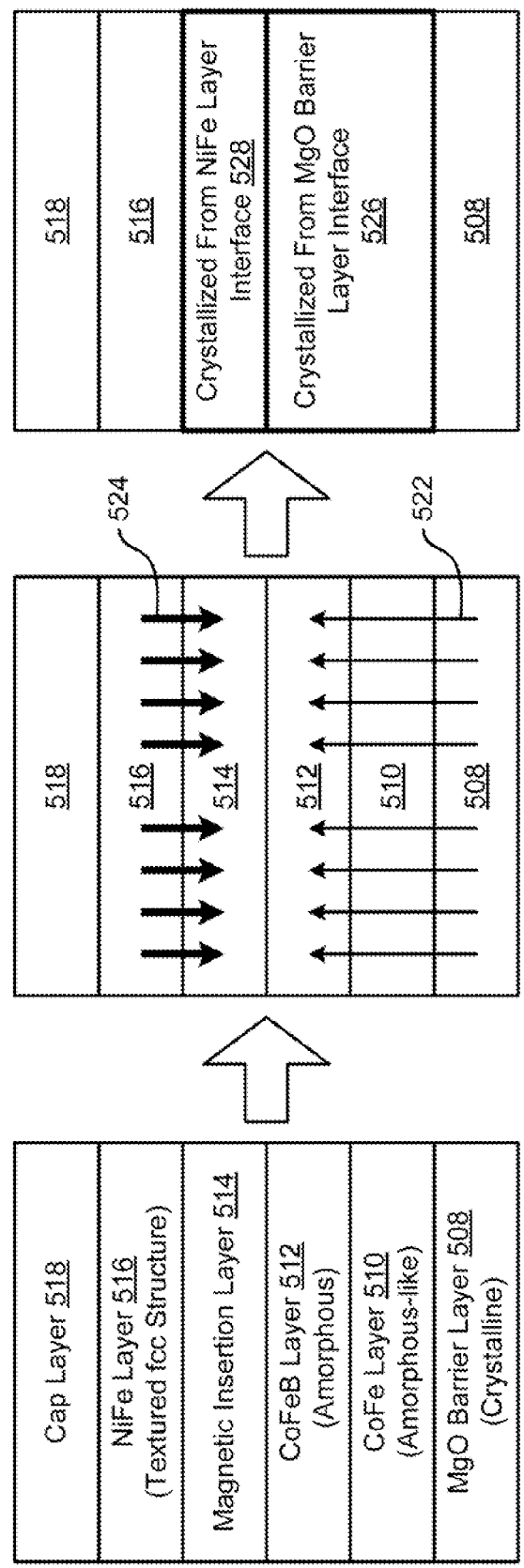
FIG. 5C is a cross-sectional view of a portion of a magnetic head during a crystallization process, according to one embodiment.

Each of FIGS. 5A-5C show portions of a magnetic head, according to various embodiments. The thickness of each layer, and the width of each layer, are for example only, and each layer may be thicker/thinner and/or wider/narrower. In addition, the materials recited for each material herein is for example only, and not meant to be limiting in any way unless otherwise indicated. Therefore, each layer may be comprised of any material known in the art that performs the function indicated for the layer.

Now referring to FIG. 5A, a portion of a magnetic head 500 is shown according to one embodiment. The magnetic head may include any or all of the layers shown. For example, the magnetic head 500 may include a seed layer 502, an antiferromagnetic (AFM) layer 504, a synthetic antiferromagnetic (SAF) layer 506, a barrier layer 508 (which may comprise any barrier material, such as $AlO_x$, MgO, etc., in proportions as would be known to one of skill in the art), a first magnetic layer which may include a CoFe layer 510 and a CoFeB layer 512 according to one approach, only a CoFe layer, only a CoFeB layer, etc., a magnetic insertion layer 514, a second magnetic layer 516 (which may preferably comprise CoFe, NiFe, etc., in some approaches), and a cap layer 518. In this embodiment, a free layer 520 may be comprised of four layers: the CoFe layer 510, the CoFeB layer 512, the magnetic insertion layer 514, and the second magnetic layer 516, in one approach.

Now referring to FIG. 5B, a portion of a magnetic head 530 is shown according to another embodiment. In this embodiment, the layers are all similar to the embodiment shown in FIG. 5A, except that there is no CoFeB layer (512, FIG. 5A) which results in the first magnetic layer 510, as shown in FIG.

5B, being preferably comprised of CoFe. This also produces a magnetic head 530 having a free layer 520 with three layers: the first magnetic layer 510, the magnetic insertion layer 514, and the second magnetic layer 516, in one approach.

Unlike in magnetic heads produced according to the prior art, which typically use a non-magnetic metal layer between the first magnetic layer and the second magnetic layer, a high spin polarization amorphous magnetic layer may be used as an insertion layer according to various embodiments. As shown in FIGS. 5A-5B, this layer is the magnetic insertion layer 514.

The crystallization temperature of CoFeB when doped with a fourth element, such as Ta, Ru, Hf, etc., increases significantly compared to that of CoFeB itself. When this fourth element is distributed uniformly in the CoFeB layer, CoFeB(X), where X is the fourth doping element, such as Ta, Ru, Hf, etc., shows a single magnetic phase, which provides a solution for the magnetic coupling problem and noise source which are present in heads having a non-magnetic insertion layer, such as pure Ta. In some approaches, the percentage of X in the CoFeB(X) layer may be at or below about 15 at. % in total content of the CoFeB alloy. In more preferred approaches, it may be less than about 10 at. %.

When the amorphous magnetic insertion layer CoFeB(X) is used between the first high spin polarization layer and the NiFe layer, the first amorphous magnetic layer with a high spin polarization can crystallize from the MgO/first amorphous magnetic layer interface, resulting in a good epitaxial relationship between MgO and the first amorphous magnetic layer. The MR of the structure also increases with this amorphous magnetic insertion layer present, according to additional approaches. This amorphous magnetic insertion layer may also be used as the first magnetic layer directly, which produces a relatively high MR. A MgO TMR sensor with a first layer as described above may also have a high MR ratio, narrow shield-to-shield spacing, and the sensing layer may be magnetically soft with low magnetostriction, according to various implementations.

Figure 8:
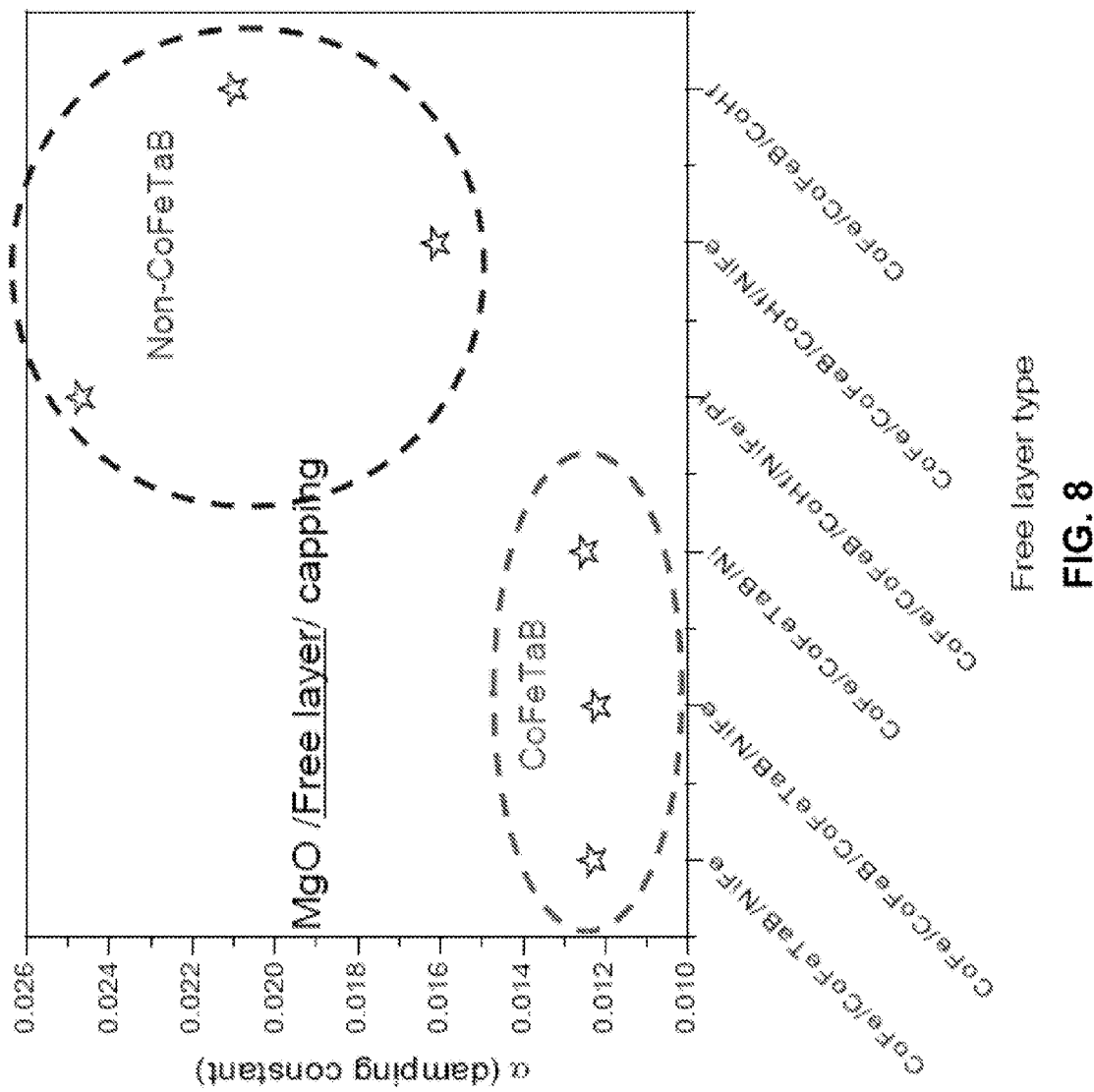
FIG. 8 is a plot of damping constant versus free layer type using different insertion layer materials, according to one example.

Now referring to FIG. 8, which is a plot of damping constant versus free layer type using different insertion layer materials according to one example, there is another aspect of the magnetic insertion layer that may be useful in magnetic heads. Compared to a non-CoFeTaB insertion layer, a CoFeTaB magnetic insertion layer has a much smaller damping constant which is proportional to the noise generated by the head in operation. This noise reduction, as compared to a head using a non-CoFeTaB insertion layer, may lead to an increased signal-to-noise ratio (SNR) for the magnetic head. Therefore, the magnetic insertion layer may produce a higher TMR, as well as provide lower noise, both of which are desirable effects.

Now referring to FIG. 5C, a portion of a magnetic head is shown during a crystallization process which may occur after formation of the layers of the head, according to one embodiment. In FIG. 5C, according to one embodiment, the barrier layer 508 is shown comprising crystalline MgO, the first magnetic layer 510, 512 is shown comprising a stack of amorphous-like CoFe and amorphous CoFeB, the second magnetic layer 516 is shown comprising NiFe having a textured face-centered cubic (fcc) structure. The cap layer 518 is also shown, but is not necessary in some approaches. In addition, the first magnetic layer may comprise the CoFe layer 510 without the CoFeB layer 512, in some approaches. The first magnetic layer, in either embodiment (e.g., with or without the CoFeB layer 512) may be a high spin polarization amorphous magnetic material. After formation of the stack, crystallization at heterogeneous interfaces may occur.

According to one preferred embodiment, the magnetic insertion layer may be comprised of an amorphous magnetic material, such as CoFeB doped with a material, e.g., Ta, Ru, Hf, etc.

According to one embodiment where the free layer has four layers (510, 512, 514, 516, as shown in FIG. 5A), there may be two crystalline/amorphous interfaces. These interfaces occur when the CoFe layer 510 is amorphous or amorphous-like, the CoFeB layer 512 is amorphous, the barrier layer 508 is crystalline, and the second magnetic layer 516 has a textured fcc structure. One interface is the MgO/CoFe—CoFeB interface 522 between the barrier layer 508 and the first magnetic layer, and the other interface is the NiFe/CoFeB interface 524 between the CoFeB layer 512 and the second magnetic layer 516. The degree of crystallization 522 from the MgO/CoFe—CoFeB interface may be more deterministic on the overall performance of the magnetic head than the degree of crystallization 542 from the other interface, according to one embodiment. Once the crystallization occurs, the structure may include a crystallized layer 528 above a thicker crystallized layer 526.

Without an amorphous magnetic insertion layer, crystallization from the NiFe interface would occur much faster than from the MgO interface, leading to an undesirably low MR. The amorphous magnetic insertion layer (CoFeB—(X)) 514 having a high crystallization temperature increases the degree of the crystallization from the MgO/CoFe—CoFeB interface because it is located at the NiFe interface. Therefore, an epitaxial relationship between the MgO barrier layer 508 and the first magnetic layer forms, leading to a desirably high MR. This embodiment having an amorphous magnetic insertion layer 514 produces a much higher MR compared to a magnetic head without a magnetic insertion layer, in some approaches.

Figure 6:
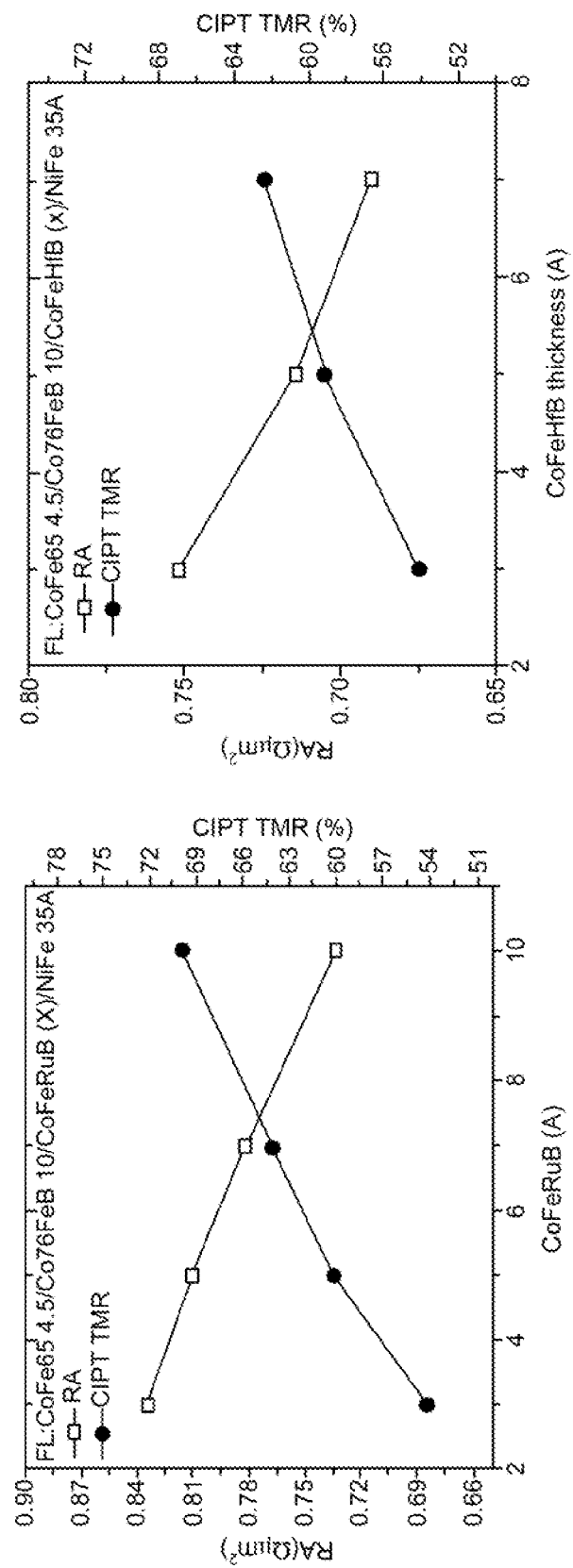
FIG. 6 shows two charts of RA and TMR percentage for magnetic heads having different insertion layers and thicknesses, according to several embodiments.

Now referring to FIG. 6, two charts are shown that describe desired effects of using a magnetic head formed through the processes described herein, according to various embodiments.

In the chart on the left, resistance times area (RA) is shown along with a CIPT TMR percentage for a magnetic head using a CoFeB(Ru) insertion layer of varying thicknesses. In the chart on the right, RA and TMR percentage are shown for a magnetic head using a CoFeB(Hf) insertion layer of varying thicknesses. The better the TMR percentage, the better the performance of the magnetic head will be in use. As can be seen from these charts, the thicker the insertion layer is, the higher the TMR, which is desired. As the TMR percentage increases, a corresponding decrease in RA is observed. Therefore, for a particular magnetic head design, a thickness of the insertion layer may be determined based on the desired RA and TMR of the magnetic head.

Figure 7:
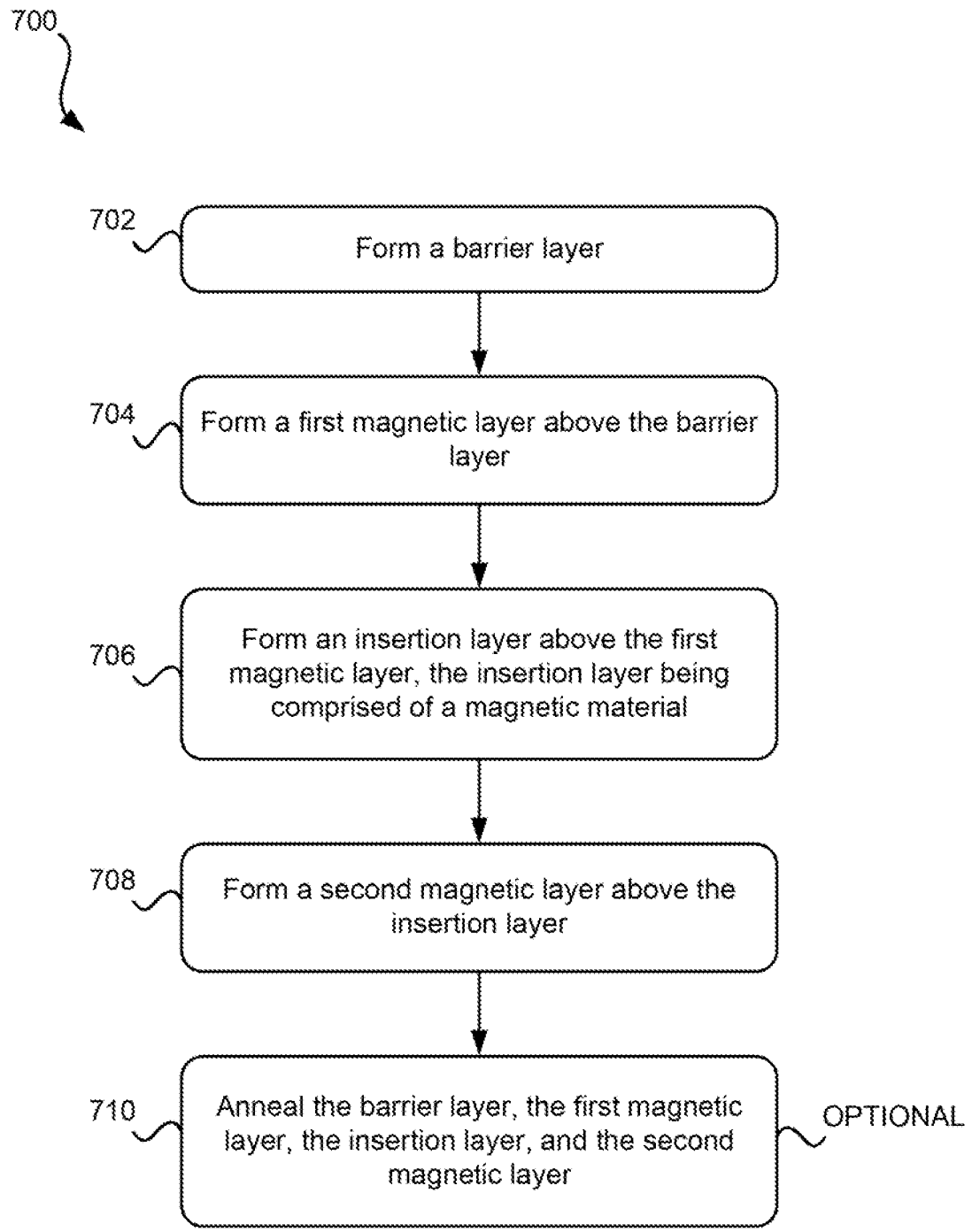
FIG. 7 is flowchart of a method for forming a magnetic head, according to one embodiment.

Now referring to FIG. 7, a method 700 for forming a magnetic head is shown according to one embodiment. The method 700 may be performed in any desired environment, and may include any of the embodiments and/or approaches described herein, including FIGS. 1-5. The method 700 may include more or less steps than those described below. Moreover, while certain dimensions and materials are presented, this is done by way of example only.

In operation 702, a barrier layer is formed. The barrier layer, according to one embodiment, may have a crystalline structure. In one preferred embodiment, the barrier layer may comprise a metal oxide, such as MgO, having a crystalline structure. Any method may be used to form the barrier layer as known in the art, such as sputtering.

According to one illustrative embodiment, the barrier layer may be direct deposited using an added MgO target. In another embodiment, the barrier layer may be formed through sputtering of Mg and then exposing the Mg to an oxidizer, thereby forming MgO, under conditions that form a crystalline structure.

According to some embodiments, the barrier layer may be formed to a thickness in a stack height direction of from about 8 Å to about 12 Å. According to one preferred embodiment, thickness of the barrier layer may be about 10 Å.

In operation 704, a first magnetic layer is formed above the barrier layer. The first magnetic layer may be formed through any technique known in the art, such as sputtering.

According to one embodiment, the first magnetic layer may comprise a high spin polarization magnetic material having an amorphous structure. Some materials include CoFe, CoFeB, NiFe, etc.

In another embodiment, the first magnetic layer may be a multilayer, which may include a first layer comprising CoFe above the barrier layer and a second layer comprising CoFeB above the first layer. In this embodiment, the CoFe layer may be amorphous-like when formed, and the CoFeB layer may be amorphous when formed.

According to one embodiment, the thickness of the first magnetic layer may be from about 3 Å to about 5 Å in a stack height direction.

In operation 706, an insertion layer is formed above the first magnetic layer. The insertion layer comprises a magnetic material. Any method may be used to form the insertion layer as known in the art, such as sputtering.

In one embodiment, the insertion layer may comprise CoFeB doped with a material, such as Ta, Ru, Hf, and mixtures thereof. In some approaches, the percentage of the dopant in the CoFeB insertion layer may be at or below about 15 at. % in total content of the CoFeB alloy. In more preferred approaches, it may be less than about 10 at. %. In one approach, the insertion layer's formation, partly due to the addition of the dopant material, aligns with the barrier layer's crystallization instead of aligning with the crystallization of the second magnetic layer.

According to one embodiment, the thickness of the insertion layer may be from about 15 Å to about 30 Å in a stack height direction.

In operation 708, a second magnetic layer is formed above the insertion layer. The second magnetic layer, in a preferred embodiment, may have a face-centered cubic structure. Any method may be used to form the second magnetic layer as known in the art, such as sputtering.

According to one embodiment, the second magnetic layer may comprise NiFe, or any other material as would be known in the art, such as CoFe, CoFeB, etc.

In one approach, the thickness of the second magnetic layer in a stack height direction may be from about 30 Å to about 50 Å.

In optional operation 710, the layers of the stack, e.g., the barrier layer, the first magnetic layer, the insertion layer, and the second magnetic layer, may be annealed through any annealing process as known in the art. According to some embodiments, the layers may be annealed at a temperature of from about 250° C. to about 300° C. for between about 3 and about 7 hours. In one particular embodiment, the annealing temperature may be about 280° C. and the annealing may take place for about 5 hours. Of course, the temperature and the annealing time may be selected based on thicknesses of the layers, layer composition, etc., as would be known in the art.

The annealing, in one embodiment, causes the first magnetic layer to have a crystalline structure more similar to a crystalline structure of the barrier layer than a crystalline structure of the second magnetic layer, and causes the magnetic insertion layer to have a crystalline structure more similar to the crystalline structure of the second magnetic layer than the crystalline structure of the barrier layer. Preferably, this is true for greater than about 80% of the thickness of the layer, ideally greater than about 90%, and in some approaches, about 100% for the first magnetic layer.

It should be noted that methodology presented herein for at least some of the various embodiments may be implemented, in whole or in part, in computer hardware, software, by hand, using specialty equipment, etc. and combinations thereof.

While various embodiments have been described above, it should be understood that they have been presented by way of example only, and not limitation. Thus, the breadth and scope of an embodiment of the present invention should not be limited by any of the above-described exemplary embodiments, but should be defined only in accordance with the following claims and their equivalents.

What is claimed is:

1. A magnetic head, comprising:
   a barrier layer;
   a first magnetic layer above the barrier layer;
   a magnetic insertion layer above the first magnetic layer; and
   a second magnetic layer above the magnetic insertion layer,
   wherein the magnetic insertion layer comprises a magnetic material having a crystalline structure and a characteristic of crystallization being more similar to a crystalline structure of the second magnetic layer than a crystalline structure of the barrier layer.

2. The magnetic head of claim 1, wherein the first magnetic layer comprises a high spin polarization magnetic material having a crystalline structure and a characteristic of crystallization being more similar to a crystalline structure of the barrier layer than a crystalline structure of the second magnetic layer.

3. The magnetic head of claim 1, wherein the magnetic insertion layer comprises CoFeB doped with a material selected from a group consisting of: Ta, Ru, Hf, and mixtures thereof, wherein the dopant is present at or below about 15 at %.

4. The magnetic head of claim 1, wherein the first magnetic layer comprises CoFe, the second magnetic layer comprises NiFe, and the barrier layer comprises MgO.

5. The magnetic head of claim 4, wherein the first magnetic layer is a multilayer, comprising:
   a first layer comprising CoFe; and
   a second layer comprising CoFeB above the first layer.

6. The magnetic head of claim 1, wherein the second magnetic layer has a textured face-centered cubic (fcc) structure.

7. The magnetic head of claim 1, wherein the barrier layer has a crystalline structure.

8. The magnetic head of claim 1, further comprising, below the barrier layer:
   an antiferromagnetic (AFM) layer; and
   a synthetic antiferromagnetic (SAF) layer above the AFM layer.

9. A magnetic data storage system, comprising:
   a magnetic head as recited in claim 1;
   a drive mechanism for passing a magnetic medium over the magnetic head; and
   a controller electrically coupled to the magnetic head for positioning the magnetic head.

10. The magnetic head of claim 1, wherein a portion of the first magnetic layer has a characteristic of being crystallized from an interface with the barrier layer, the degree of crystallization depending on a distance in a stack height from the barrier layer.

11. The magnetic head of claim 1, wherein a portion of the magnetic insertion layer has a characteristic of being crystallized from an interface with the second magnetic layer, the degree of crystallization depending on a distance in a stack height from the second magnetic layer.

12. A method for forming the magnetic head of claim 1, the method comprising:
forming the barrier layer;
forming the first magnetic layer above the barrier layer;
forming the insertion layer above the first magnetic layer; and
forming the second magnetic layer above the insertion layer.

13. The method of claim 12, wherein the barrier layer has a crystalline structure and the second magnetic layer has a face-centered cubic structure.

14. The method of claim 12, wherein the first magnetic layer comprises a high spin polarization magnetic material having an amorphous structure when deposited.

15. The method of claim 14, further comprising annealing the barrier layer, the first magnetic layer, the insertion layer, and the second magnetic layer, wherein the annealing causes the first magnetic layer to have a crystalline structure more similar to a crystalline structure of the barrier layer than a crystalline structure of the second magnetic layer, and wherein the annealing causes the magnetic insertion layer to have a crystalline structure more similar to the crystalline structure of the second magnetic layer than the crystalline structure of the barrier layer.

16. The method of claim 12, wherein the first magnetic layer comprises CoFe, the second magnetic layer comprises NiFe, and the barrier layer comprises MgO.

17. The method of claim 16, wherein the first magnetic layer is a multilayer, and further comprising:

forming a first layer comprising CoFe above the barrier layer; and
forming a second layer comprising CoFeB above the first layer.

18. The method of claim 17, wherein the insertion layer comprises CoFeB doped with a material selected from a group consisting of: Ta, Ru, Hf, and mixtures thereof.

19. A magnetic head, comprising:
a barrier layer having a crystalline structure;
a first magnetic layer above the barrier layer;
a magnetic insertion layer above the first magnetic layer; and
a second magnetic layer above the magnetic insertion layer, the second magnetic layer having a textured face-centered cubic (fcc) structure,
wherein the first magnetic layer comprises a high spin polarization magnetic material having a crystalline structure and a characteristic of crystallization being more similar to the crystalline structure of the barrier layer than a crystalline structure of the second magnetic layer, and
wherein the magnetic insertion layer comprises a magnetic material having a crystalline structure and a characteristic of crystallization being more similar to the crystalline structure of the second magnetic layer than the crystalline structure of the barrier layer.

20. A magnetic data storage system, comprising:
a magnetic head as recited in claim 19;
a drive mechanism for passing a magnetic medium over the magnetic head; and
a controller electrically coupled to the magnetic head for positioning the magnetic head.

21. The magnetic head of claim 19, wherein the magnetic insertion layer comprises CoFeB doped with a material selected from a group consisting of: Ta, Ru, Hf, and mixtures thereof, wherein the dopant is present at or below about 15 at %.

* * * * *